United States Patent [19]

Page et al.

[11] 4,332,624

[45] Jun. 1, 1982

[54] METHOD OF CLEANING A FIRED THICK FILM COPPER LAYER

[75] Inventors: Jay P. Page, Phoenix, Ariz.; Arthur H. Mones, Edina, Minn.

[73] Assignee: Honeywell Information Systems Inc., Phoenix, Ariz.

[21] Appl. No.: 212,763

[22] Filed: Dec. 3, 1980

[51] Int. Cl.$^3$ ............................. B08B 3/08; C23G 1/10
[52] U.S. Cl. .......................................... 134/3; 134/28
[58] Field of Search ...................... 134/3, 28; 156/666, 156/663

[56] References Cited

U.S. PATENT DOCUMENTS 3,181,984  5/1965  Tillis .................................. 134/3 X
4,175,011  11/1979  Spiliotis ......................... 156/666 X
4,198,262  4/1980  Gay .................................... 134/3 X

*Primary Examiner*—Marc L. Caroff
*Attorney, Agent, or Firm*—E. W. Hughes; W. W. Holloway, Jr.; N. Prasinos

[57] ABSTRACT

Exposed surfaces of a layer of a copper thick film paste on a multilayer substrate are cleaned after being fired so that such surfaces are readily solderable to the extent that conventional tin/lead solders will wet said surfaces. The substrate with the exposed surfaces of a layer of a fired copper thick film paste is cleaned by being immersed in a warm dilute solution of an acid containing a fluoride ion, such as HF or $HBF_4$ for a short period of time. After the short period of time of immersion has elapsed, the substrate is removed from the dilute acid solution and rinsed to remove substantially all traces of the cleaning solution.

4 Claims, No Drawings

METHOD OF CLEANING A FIRED THICK FILM COPPER LAYER

BACKGROUND OF THE INVENTION

1. Field of the Invention

This invention is in the field of methods of cleaning copper surfaces so that such surfaces are readily solderable.

2. Description of the Prior Art

Copper surfaces that are to be soldered to other compatible metal surfaces, such as copper, typically need to be cleaned prior to being soldered either mechanically or chemically. Mechanical processes usually abrade the outer, or exposed, surfaces of the copper to produce a surface that is not contaminated by materials that would prevent a tin/lead solder, for example, from wetting the surfaces. When physical processes of cleaning a surface to be soldered are not practical or desirable because of the damage they cause, chemical processes for cleaning such surfaces are used. The active ingredient of most chemical processes is a dilute solution of phosphoric acid or a dilute solutioon of ammonium hydroxide, for example.

The development of integrated circuits (I.C.) semi-conductor devices with ever-increasing numbers of active gates, or transistors, per device and with the delay per gate decreasing, has resulted in a requirement for better ways of interconnecting such I.C. chips into desired circuits by using conductors of minimum length to take advantage of the high-speed characteristics of such devices. One way of interconnecting such devices is to mount I.C. chips on a multilayer substrate and to interconnect the chips on a substrate by means of multiple layers of conductor runs, or conductors. The conductors are separated both horizontally and vertically by layers of a dielectric, or electrical insulator, except for the top surfaces of the top one or two of such conductor layers. Connections between conductors in different layers are made by vias, openings in the dielectric layers, which vias are then filled with an electrical conductor.

The base of many such multilayer substrates is a plate or sheet of alumina, $Al_2O_3$. Because of the characteristics of an alumina base; namely, that it can be subjected to high temperatures without substantial damage or change of dimension, alumina bases are frequently used to build multilayer substrates. On such alumina bases, layers of thick film pastes, either conductor or dielectric pastes, are sequentially applied to create alternate layers of conductors and insulators with the necessary interconnections between conductors and devices to produce a desired electronic circuit. After a layer of conductor or dielectric paste is applied, using a conventional silkscreening printing process, the layer is fired to cause it to adhere to the base, or lower layers, and to cause the particles of the layer to fuse together. The uppermost layer or layers of conductors, particularly where the terminals of I.C. chips are to be connected into the circuit or on which the chips themselves are to be mounted, is left exposed.

As mentioned above, thick film pastes containing particles of a good electrical conductor are applied typically by a screen printing process. To minimize corrosion and to achieve good electrical conductivity, thick film pastes containing a large percentage of gold particles have heretofore been the most common type of thick film electrically conductive paste used to produce the conductor runs of such substrates. The high cost of gold has been a powerful stimuli to use less costly conductive metals in the thick film conductor pastes. Copper thick film pastes have been developed, and multilayer substrates having conductor runs principally of a fired layer of a copper thick film paste have been built. However, attempts to solder electrical leads with conventional tin/lead solders to exposed surfaces of such copper runs have encountered problems because the melted solder would not wet, or adhere to, the exposed surfaces of copper on the substrate. Because of the structure of the substrate, mechanical abrasion processes for cleaning such areas is not an acceptable solution as mechanical cleaning damages the upper surface of the substrate to the point where the substrate would be unusable for its intended purpose. Tests using the typical chemical processes using dilute solutions of phosphoric acid or of ammonium hydroxide did not result in such surfaces becoming solderable.

SUMMARY OF THE INVENTION

The present invention provides a method of cleaning exposed surfaces of a fired layer of a copper thick film paste which has been applied to a multilayer substrate. A cleaning solution of an acid containing a fluoride ion is heated to a temperature slightly above normal room temperature. The substrate is immersed in the warm cleaning solution for a short period of time, measured in seconds. The substrate, after the prescribed period of immersion has passed, is removed from the cleaning solution, and is then rinsed in a pure, de-ionized water to remove substantially all of the cleaning solution. When dry, the exposed surfaces of the fired copper thick film layer are readily solderable by a conventional tin/lead solder using conventional processes.

DESCRIPTION OF THE INVENTION

The method of cleaning a fired thick film copper layer on a multilayer substrate of this invention produces a chemically clean surface on the copper layer that is readily solderable using conventional tin/lead solders, such as 60% tin, 40% lead, and the like.

Conventional silkscreening printing processes using copper thick film pastes, such as that commercially available as product No. 9923 of the DuPont de Nemours Company, have been used to produce the copper conductive runs of a multilayer substrate. Essentially, the process of using thick film copper pastes to produce conductor runs of such substrates is that used in producing gold thick film conductor runs on similar substrates.

However, when attempts were made to solder leads or devices to the exposed areas of a fired copper thick film conductor on a multilayer substrate using conventional tin/lead solders, it was discovered that such solders would not wet the exposed surfaces of the fired thick film layer of copper. Use of conventional processes for cleaning copper surfaces to render them readily solderable such as using weak solutions of phosphoric acid ($H_3PO_4$) or ammonium hydroxide ($NH_4OH$) failed to improve the solderability of the exposed surfaces of the layer of fired thick film copper on a multilayer substrate.

Copper thick film paste contains approximately 8-9 percent by weight of glass frit. The function of the glass frit is to bind the particles of copper together and to bind the conductor layer to either the alumina base or to a dielectric layer over which the copper thick film paste is applied. It should also be noted that the dielectric thick film pastes which are used to provide electrical insulation between conductor runs of such substrates also contain substantial percentages by weight of glass frit. Applicants theorize that as a copper thick film paste layer is fired, the glass frit melts or, at least, molecules of glass migrate to the exposed surfaces and form a thin layer of glass that overlies the exposed areas of a copper run. It is believed that it is the presence of this thin layer of glass that prevents the solder from wetting the exposed surfaces of such a fired layer of copper. It also appears that resistance to being soldered demonstrated by the surfaces of the fired copper thick film conductor increases when the fired copper layer overlies a dielectric layer which, as pointed out above, includes even more glass frit than such a copper conductor.

The presence of a very thin outer layer of a glasslike composition would also explain why conventional cleaners used to clean or prepare copper surfaces on multilayer circuit boards, for example, so they can be soldered using conventional tin/lead solders, fail since glasses or glasslike materials are substantially impervious to chemical attack by these previously used chemicals. Acids containing the fluoride ions, such as $HBF_4$ or hydrofluoric acid, HF, do attack glass and applicants have discovered that cleaning the exposed surfaces of the fired layer of a copper thick film paste on a multilayer substrate successfully cleans such surfaces so that they are readily solderable, or tin/lead solder wets them easily, so that leads and devices can be successfully soldered to such areas.

Multilayer substrates having an alumina base and a dimension of 3 inches—3 inches×0.080 inches thick, for example, have applied to them up to 14 layers of dielectric and conductor copper on one side, or on a major surface, of such a substrate. Each layer is screened, or applied, using conventional silkscreening techniques with the dielectric being a conventional thick film dielectric paste, such as that commercially available as product No. 4175, or 4275, of the DuPont Company. The copper thick film paste used to form the conductive runs is the aforementioned product No. 9923 of the DuPont Company.

After the last, or top, layer of the substrate has been applied and fired, certain areas of the top conductive layer and occasionally areas of the next lower layer are left exposed. To such exposed areas, electronic devices, such as I.C. chips and leads to such devices, are soldered. To clean such exposed areas so that they are readily solderable, they are cleaned using the following process.

A suitable container has placed in it a weak solution, 5 percent or less, of fluoroboric acid, $HBF_4$, or of hydrofluoric acid, HF. This cleaner, the acid solution in the container, is heated to a temperature of substantially 40° C., which is slightly warmer than normal room temperature. The substrate is immersed in the warm cleaner containing fluoride ions for a short period of time, 10–20 seconds, with 15 seconds being the substantially optimum period of time. After this period of immersion is completed, the substrate is removed from the container containing the cleaner and rinsed thoroughly with de-ionized water until substantially all traces of the acid have been removed. The exposed copper surfaces of the substrate are chemically cleaned so that solder can be applied to them in any conventional way.

What is claimed is:

1. The method of cleaning exposed surfaces of a fired layer of thick film copper paste on a multilayer substrate, which layer has been applied to a fired layer of a dielectric containing glass frit on the substrate, comprising the steps of:
heating a weak solution consisting essentially of $HBF_4$ in amounts of up to 5%;
immersing the substrate in said solution for a period of time of from 10–20 seconds;
removing the substrate from the solution after said period of time has elapsed; and
rinsing the substrate to remove substantially all of said solution.

2. The method of cleaning exposed surfaces of a fired layer of thick film copper paste containing copper and glass frit on a multilayer substrate, which layer has been applied to a fired dielectric layer on the substrate, comprising the steps of:
heating a solution consisting essentially of 5 percent of $HBF_4$ to substantially 40° C.;
immersing the substrate in said solution for substantially 15 seconds;
removing the substrate from the solution;
rinsing the substrate in de-ionized water; and
drying the substrate.

3. The method of claim 1 in which the solution is heated to a temperature of substantially 40° C.

4. The method of claim 3 in which the substrate is rinsed in de-ionized water.

* * * * *